United States Patent
Park et al.

(10) Patent No.: US 12,433,106 B2
(45) Date of Patent: Sep. 30, 2025

(54) TRANSPARENT DISPLAY APPARATUS

(71) Applicant: LG Display Co., Ltd., Seoul (KR)

(72) Inventors: Sunghee Park, Paju-si (KR); Taehee Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 503 days.

(21) Appl. No.: 18/056,694

(22) Filed: Nov. 17, 2022

(65) Prior Publication Data

US 2023/0217728 A1 Jul. 6, 2023

(30) Foreign Application Priority Data

Dec. 28, 2021 (KR) .................. 10-2021-0190249

(51) Int. Cl.
| | |
|---|---|
| H10K 59/122 | (2023.01) |
| G02F 1/1362 | (2006.01) |
| H10K 50/844 | (2023.01) |
| H10K 59/121 | (2023.01) |
| H10K 59/88 | (2023.01) |

(52) U.S. Cl.
CPC ..... *H10K 59/122* (2023.02); *G02F 1/136286* (2013.01); *H10K 50/844* (2023.02); *H10K 59/121* (2023.02); *H10K 59/88* (2023.02)

(58) Field of Classification Search
CPC ............ G02F 1/136286; H10K 59/88; H10K 59/121; H10K 59/122; H10K 50/844
See application file for complete search history.

(56) References Cited

U.S. PATENT DOCUMENTS

| | | | |
|---|---|---|---|
| 2013/0328945 A1* | 12/2013 | Kim ................. | G02F 1/136286 |
| | | | 349/42 |
| 2019/0036057 A1* | 1/2019 | Watanabe .............. | H05B 33/22 |
| 2021/0234119 A1 | 7/2021 | Moon et al. | |

FOREIGN PATENT DOCUMENTS

KR 20210097248 A 8/2021

* cited by examiner

*Primary Examiner* — Abdulmajeed Aziz
*Assistant Examiner* — Nathaniel J Lee
(74) *Attorney, Agent, or Firm* — Seed Intellectual Property Law Group LLP

(57) ABSTRACT

A transparent display apparatus is provided, which reduces a difference in visibility between a non-display area and a display area. The transparent display apparatus comprises a display area disposed on a substrate, including a plurality of pixels having a first transmissive portion, and a non-display area disposed near the display area on the substrate, having a plurality of second transmissive portions, wherein the non-display area further includes an organic layer provided to be extended from the display area, and ratios of the organic layer overlapped with the plurality of second transmissive portions in the non-display area are different from each other.

24 Claims, 7 Drawing Sheets

TRANSPARENT DISPLAY APPARATUS

CROSS-REFERENCE TO RELATED APPLICATIONS

This application claims the benefit of the Korean Patent Application No. 10-2021-0190249 filed on Dec. 28, 2021, which is hereby incorporated by reference as if fully set forth herein.

BACKGROUND

Technical Field

The present disclosure relates to a transparent display apparatus.

Description of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, an organic light emitting display (OLED) apparatus and a quantum dot light emitting display (QLED) apparatus have been recently used.

Recently, studies for a transparent display apparatus in which a user may view objects or images positioned at an opposite side by the display apparatus are actively ongoing.

The transparent display apparatus includes a display area on which an image is displayed and a non-display area that includes a bezel area, wherein the display area may include a transmissive area capable of transmitting external light and a non-transmissive area having a light emission area. The transparent display apparatus may have high light transmittance through the transmissive area of the display area, and a light emission area may be disposed in the non-transmissive area.

Meanwhile, in the transparent display apparatus, since the display area emits light, a light emitting layer is provided in only the display area. Since light is not emitted in the non-display area, a light emitting layer is not provided in the non-display area.

BRIEF SUMMARY

The inventors have realized that a problem occurs in that a difference in visibility between the display area and the non-display area (or bezel area) occurs.

The present disclosure has been made in view of the above problems and it is technical benefit of the present disclosure to provide a transparent display apparatus that may reduce a difference in visibility between a non-display area and a display area.

In addition to the technical benefit of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display apparatus comprising a display area disposed on a substrate, including a plurality of pixels having a first transmissive portion, and a non-display area disposed near the display area on the substrate, having a plurality of second transmissive portions, wherein the non-display area further includes an organic layer provided to be extended from the display area, and ratios of overlap between the organic layer and each of the plurality of second transmissive portions in the non-display area are different from each other.

In accordance with another aspect of the present disclosure, the above and other technical benefits can be accomplished by the provision of a transparent display apparatus comprising a display area disposed on a substrate, including a plurality of pixels having a first transmissive portion, and a non-display area disposed near the display area on the substrate, having a shadowing area in which an organic light emitting layer of the display area is disposed to be extended and a plurality of second transmissive portions, wherein the non-display area further includes an organic layer provided to be extended from the display area, and ratios of overlap between the organic layer and each of the plurality of second transmissive portions are increased toward a first direction directed from the display area toward an end of the substrate in the shadowing area.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
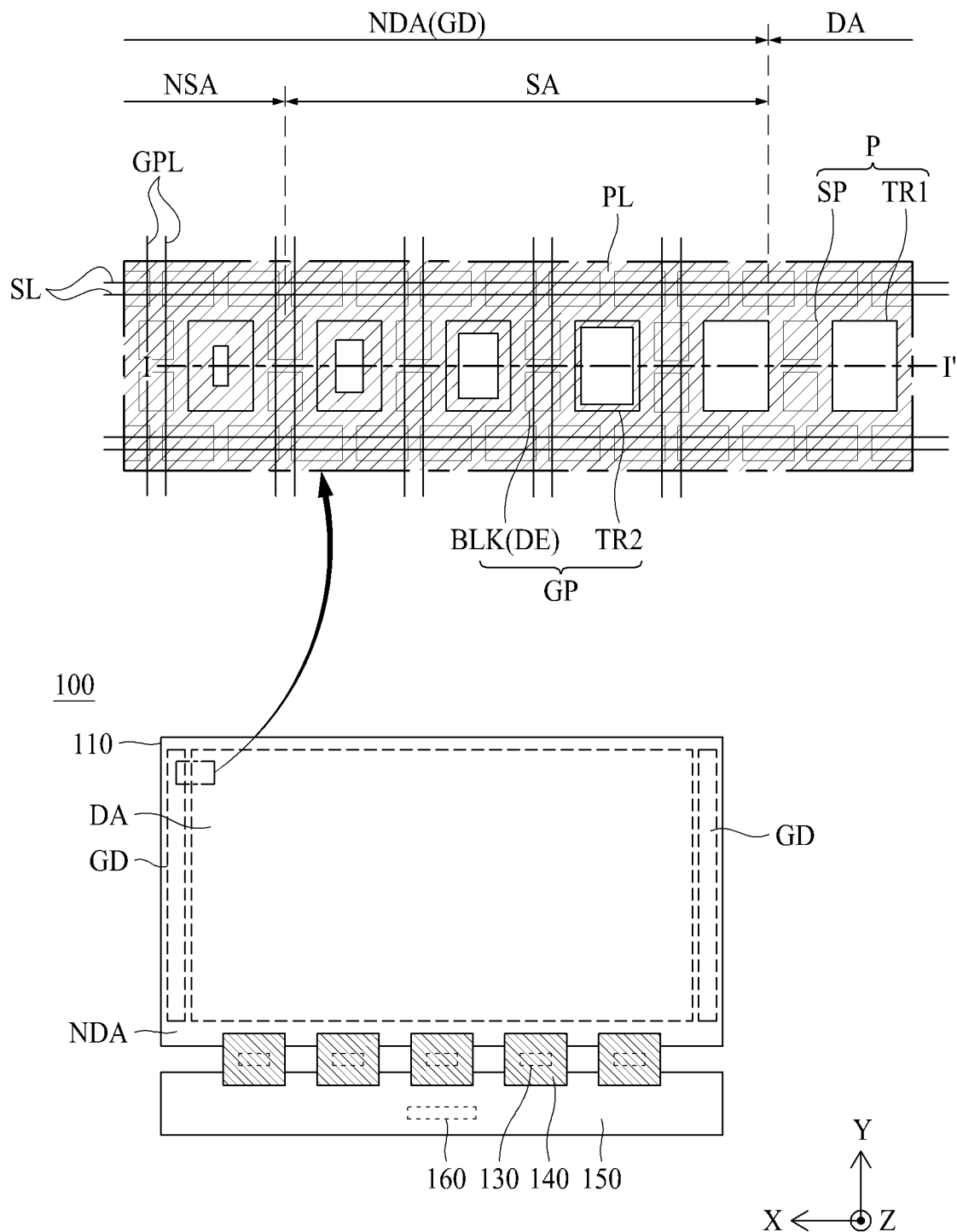
FIG. 1 is a schematic plane view illustrating a transparent display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the preferred embodiments of the present disclosure will be described in detail with reference to the accompanying drawings.

Figure 2:
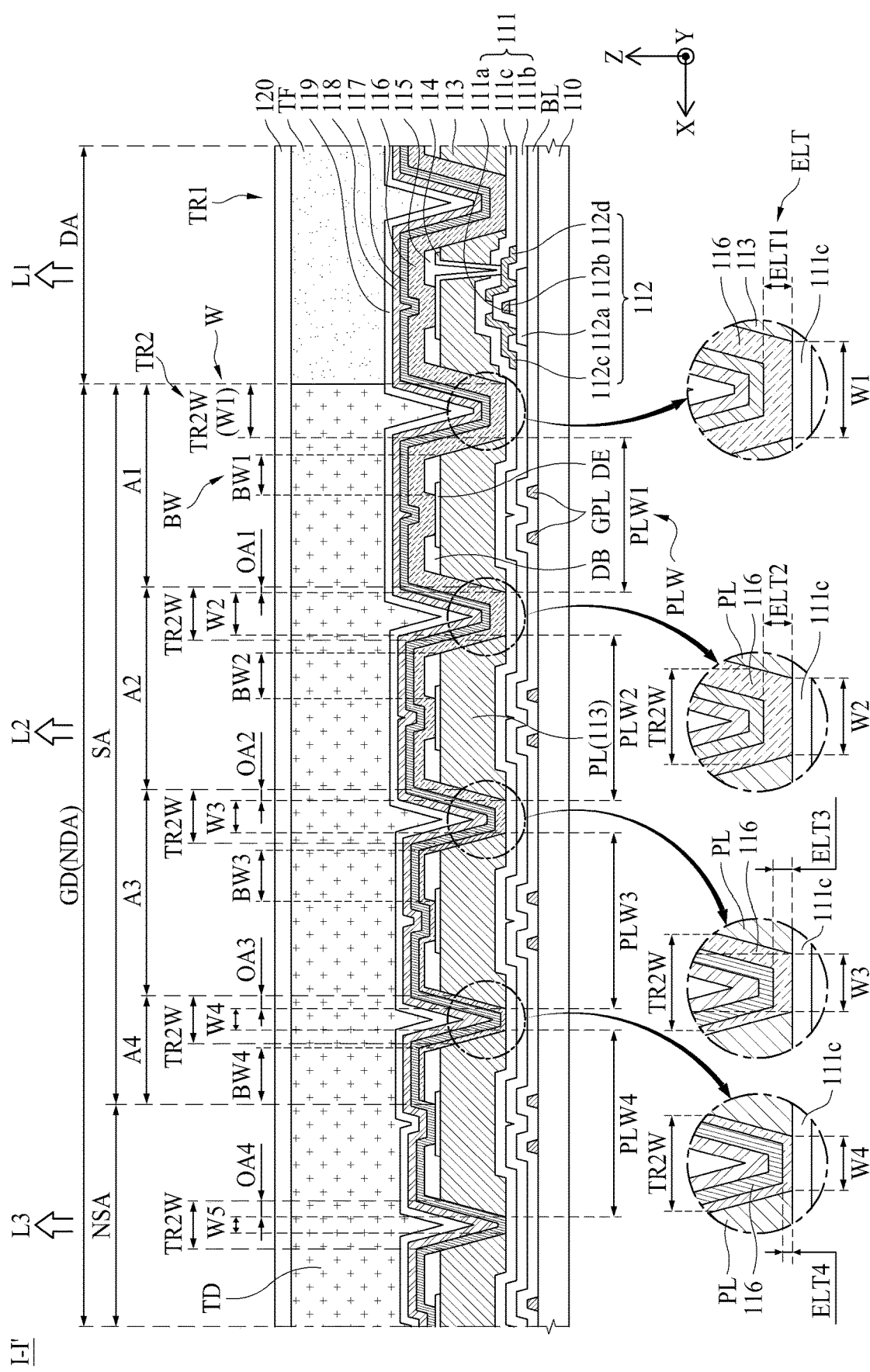
FIG. 2 is a schematic cross-sectional view taken along line I-I' shown in FIG. 1.
Figure 3:
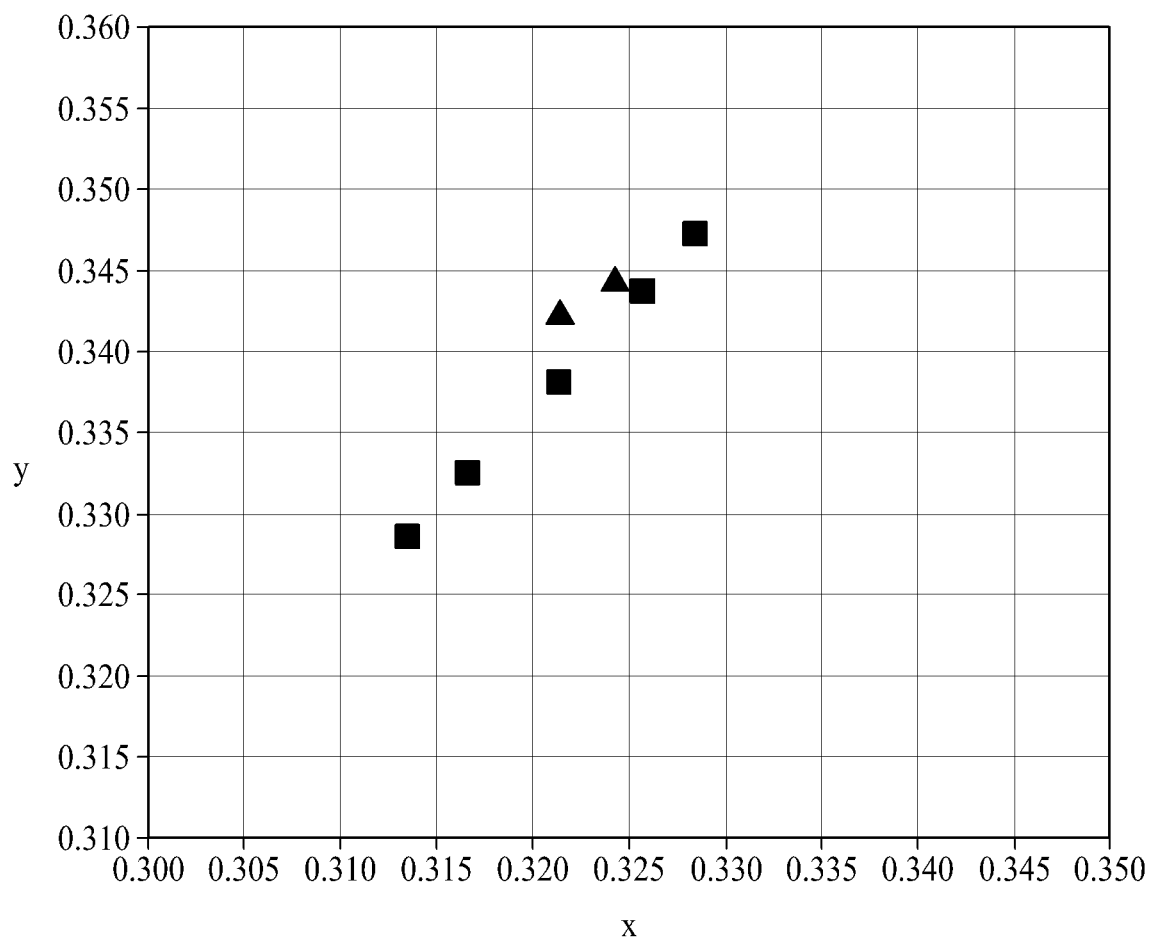
FIG. 3 is a view illustrating color coordinates of a display area and a non-display area of a transparent display apparatus according to one embodiment of the present disclosure.
Figure 4:
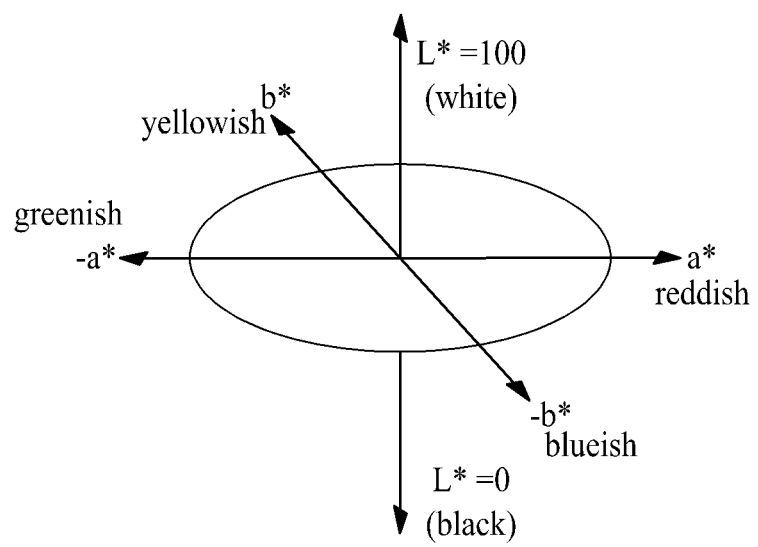
FIG. 4 is a view illustrating color coordinates to describe color coordinates of FIG. 3.

FIG. 1 is a schematic plane view illustrating a transparent display apparatus according to one embodiment of the present disclosure, FIG. 2 is a schematic cross-sectional view taken along line I-I' shown in FIG. 1, FIG. 3 is a view illustrating color coordinates of a display area and a non-display area of a transparent display apparatus according to one embodiment of the present disclosure, and FIG. 4 is a view illustrating color coordinates to describe color coordinates of FIG. 3.

Hereinafter, the following description will be based on that a transparent display apparatus 100 according to one embodiment of the present disclosure is an organic light emitting display apparatus, but is not limited thereto. That is, the transparent display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

Referring to FIGS. 1 to 4, the transparent display apparatus 100 according to one embodiment of the present disclosure may include a display panel having a gate driver GD, a source drive integrated circuit (hereinafter, referred to as "IC") 130, a flexible film 140, a circuit board 150, and a timing controller 160.

The display panel may include a substrate 110 and an opposite substrate 120, which are bonded to each other.

The substrate 110 may include a thin film transistor, and may be a transistor array substrate, a lower substrate, a base substrate, or a first substrate. The substrate 110 may be a transparent glass substrate or a transparent plastic substrate. For example, the substrate 110 may be a transparent glass substrate. Hereinafter, the substrate 110 may be referred to as a first substrate.

The opposite substrate 120 may be bonded to the first substrate 110 via a transparent connection member TD (shown in FIG. 2). For example, the opposite substrate 120 may have a size smaller than that of the first substrate 110, and may be bonded to the remaining portion except the pad area of the first substrate 110. The transparent connection member TD may be an adhesive member (or transparent adhesive). The opposite substrate 120 may be an upper substrate, a second substrate, or an encapsulation substrate. The opposite substrate 120 may be bonded to a first surface of the first substrate 110 by a substrate bonding process using an adhesive member. Hereinafter, the opposite substrate 120 may be referred to as a second substrate.

The first substrate 110 according to an example may include a display area DA and a non-display area NDA.

The display area DA is an area where an image is displayed, and may be a pixel array area, an active area, a pixel array unit, which can also be called the pixel array circuit or the pixel array structure, a display unit or structure, or a screen. For example, the display area DA may be disposed at a central portion of the display panel.

The display area DA according to an example may include gate lines, data lines, pixel driving power lines, and a plurality of pixels P. Each of the plurality of pixels P may include a plurality of subpixels SP that may be disposed at regions of overlap of the gate lines and the data lines, and a first transmissive portion TR1 disposed to be adjacent to some or all of the plurality of subpixels SP. The first transmissive portion TR1 is an area provided to allow light to transmit front and rear surfaces of the display panel. Therefore, a user located in the direction of the front surface of the display panel may view an image or background positioned in the direction of the rear surface of the display panel through the first transmissive portion TR1.

Each of the plurality of subpixels SP may be a minimum or selected unit area in which light is actually emitted.

According to one example, a plurality of subpixels SP, for example, four subpixels and one first transmissive portion TR1 constitute one unit pixel. One unit pixel may include, but is not limited to, a red subpixel, a green subpixel, a blue subpixel, a white subpixel, and a first transmissive portion TR1. As an example, one unit pixel may include at least one red subpixel, at least one green subpixel, at least one blue subpixel, at least one white subpixel, and at least one first transmissive portion TR1. As shown in FIG. 1, the plurality of subpixels SP may be provided to surround the first transmissive portion TR1.

Each of the plurality of subpixels SP includes a thin film transistor and a light emitting portion connected to the thin film transistor. The light emitting portion may include a light emitting element layer (or organic light emitting layer) interposed between a first electrode and a second electrode.

The light emitting element layers respectively disposed in the plurality of subpixels SP may individually emit light of their respective colors different from one another or commonly emit white light. According to an example, when the light emitting element layers of the plurality of subpixels SP commonly emit white light, each of the red subpixel, the green subpixel and the blue subpixel may include a color filter (or wavelength conversion member) for converting white light into light of its respective different color. In this case, the white subpixel according to an example may not include a color filter. At least a portion of the white subpixel according to another example may include the same color filter as any one of the red subpixel, the green subpixel and the blue subpixel.

Each of the subpixels SP supplies a predetermined or selected current to the organic light emitting element in accordance with a data voltage of the data line when a gate signal is input from the gate line by using the thin film transistor. For this reason, the light emitting portion of each of the subpixels may emit light with a predetermined or selected brightness in accordance with the predetermined or selected current. A structure of each of the subpixels SP will be described later with reference to FIG. 2.

The non-display area NDA may be an area where an image is not displayed, and may be a peripheral circuit area, a signal supply area, a non-active area, or a bezel area. The non-display area NDA may be configured to be around the display area DA. That is, the non-display area NDA may be disposed to surround the display area DA.

The transparent display apparatus 100 according to one embodiment of the present disclosure may include a second transmissive portion TR2 provided in the non-display area NDA.

The second transmissive portion TR2 is an area provided to allow light to transmit the front and rear surfaces of the display panel like the first transmissive portion TR1. Therefore, a user located in the direction of the front surface of the display panel may view an image or background positioned in the direction of the rear surface of the display panel even through the second transmissive portion TR2 provided in the non-display area NDA.

As a result, since the transparent display apparatus 100 according to one embodiment of the present disclosure may transmit an image or background disposed in the direction of the front surface or the rear surface of the display panel through the first transmissive portion TR1 provided in the display area DA and the second transmissive portion TR2 provided in the non-display area NDA, light transmittance may be more improved than the case that the transmissive portion is provided only in the display area. In addition, in the transparent display apparatus 100 according to one embodiment of the present disclosure, as the second transmissive portion TR2 is provided in the non-display area NDA in the same manner that the first transmissive portion TR1 is provided in the display area DA, the display area DA and the non-display area NDA are provided in a similar structure, whereby a visibility difference between the display area DA and the non-display area NDA may be reduced, and thus characteristics of visibility of the entire screen may be improved.

Referring back to FIG. 1, the non-display area NDA may be disposed at an edge portion of the display panel. The non-display area NDA according to one example may include a gate driver GD. The gate driver GD supplies gate signals to the gate lines in accordance with the gate control signal input from the timing controller 160. The gate driver GD may be formed on one side of the display area DA of the display panel or on the non-display area NDA outside both sides of the display area DA in a gate driver in panel (GIP) method as shown in FIG. 1. Alternatively, the gate driver GD may be manufactured as a driving chip, packaged in a flexible film and attached to the non-display area NDA outside one side or both sides of the display area DA of the display panel by a tape automated bonding (TAB) method. The gate driver GD according to one example may include a plurality of gate driving circuits (not shown) and a plurality of lines. The plurality of lines according to one example may include a plurality of signal lines SL disposed in a first direction (X-axis direction) and a plurality of GIP lines GPL disposed in a second direction (Y-axis direction). The plurality of signal lines SL may be disposed to be extended to the display area DA.

The plurality of gate driving circuits may be divisionally disposed on a GIP area GD of a left side of the display area DA, that is, a first non-display area and on a GIP area of a right side of the display area DA, that is, a second non-display area. According to an example, the gate driving circuit disposed in the first non-display area may be electrically connected to each of the gate lines disposed in the display area DA, and the gate driving circuit disposed in the second non-display area may be electrically connected to each of the gate lines disposed in the display area DA. For example, the gate driving circuit of the first non-display area may be connected to one side of each of the gate lines, and the gate driving circuit of the second non-display area may be connected to the other side of each of the gate lines.

According to another example, the gate driving circuit of the first non-display area may be electrically connected to each of odd-numbered (or even-numbered) gate lines of the gate lines disposed in the display area DA, and the gate driving circuit of the second non-display area may be electrically connected to each of even-numbered (or odd-numbered) gate lines of the gate lines disposed in the display area DA. For example, the gate driving circuit of the first non-display area may be connected to one side of each of the odd-numbered gate lines, and the gate driving circuit of the second non-display area may be connected to the other side of each of the even-numbered gate lines.

The plurality of gate driving circuits 200 may output gate control signals supplied from a plurality of pads and gate signals sequentially shifted based on gate circuit driving power sources. To this end, each of the plurality of gate driving circuits may include a plurality of GIP circuits (not shown) and a plurality of GIP lines GPL. The GIP circuit (not shown) according to one example may be a thin film transistor of the gate driver GD. Therefore, the plurality of GIP circuits may be provided in a structure similar to that of the thin film transistor 112 of the pixel P.

The plurality of GIP circuits and a plurality of GIP lines GIP according to one example may be disposed below the GIP portion GP or a dummy electrode DE. The plurality of GIP circuits may be disposed to surround the second transmissive portion TR2. The plurality of GIP lines GPL may be disposed between the second transmissive portions TR2 so as not to overlap the second transmissive portion TR2. As shown in FIG. 1, the plurality of GIP circuits and the dummy electrodes DE disposed on the plurality of GIP lines GPL may be disposed to surround the second transmissive portion TR2 while being adjacent to the second transmissive portion TR2. In the transparent display apparatus 100 according to one embodiment of the present disclosure, the second transmissive portion TR2 and the dummy electrode DE (or the plurality of GIP circuits) may be disposed so as not to overlap each other, whereby light transmittance of the second transmissive portion TR2 may be further improved.

Referring back to FIG. 1, the source drive IC 130 receives digital video data and a source control signal from the timing controller 160. The source drive IC 130 converts the digital video data into analog data voltages in accordance with the source control signal and supplies the analog data voltages to the data lines. When the source drive IC 130 is manufactured as a driving chip, the source drive IC 130 may be packaged in the flexible film 140 in a chip on film (COF) method or a chip on plastic (COP) method.

Pads, such as data pads, may be formed in the non-display area NDA of the display panel. Lines connecting the pads with the source drive IC 130 and lines connecting the pads with lines of the circuit board 150 may be formed in the flexible film 140. The flexible film 140 may be attached onto the pads by using an anisotropic conducting film, whereby the pads may be connected with the lines of the flexible film 140.

The circuit board 150 may be attached to the flexible films 140. A plurality of circuits implemented as driving chips may be packaged in the circuit board 150. For example, the timing controller 160 may be packaged in the circuit board 150. The circuit board 150 may be a printed circuit board or a flexible printed circuit board.

The timing controller 160 receives the digital video data and a timing signal from an external system board through a cable of the circuit board 150. The timing controller 160 generates a gate control signal for controlling an operation timing of the gate driver GD and a source control signal for controlling the source drive ICs 130 based on the timing signal. The timing controller 160 supplies the gate control signal to the gate driver GD, and supplies the source control signal to the source drive ICs 130.

Referring to FIG. 1, the first transmissive portion TR1 may be disposed to be adjacent to at least a portion of the plurality of subpixels SP, and may be included in one pixel P. Since the plurality of pixels P are provided in the display area DA, a plurality of the first transmissive portions TR1 may be provided in the display area DA. Although the first transmissive portion TR1 is illustrated as being provided in a rectangular shape in FIG. 1, the first transmissive portion TR1 is not limited thereto. The first transmissive portion TR1 may be provided in various shapes.

Likewise, the second transmissive portion TR2 according to an example may be provided in the same form as that of the first transmissive portion TR1. In this case, the same form means the same shape, and is not intended to mean the same size (or area). However, the present disclosure is not necessarily limited to this example, and the second transmissive portion TR2 may be provided not only in the same shape but also in the same size (or area) as that of the first transmissive portion TR1.

In the transparent display apparatus 100 according to one embodiment of the present disclosure, the second transmissive portion TR2 is disposed in the non-display area NDA, so that overall light transmittance may be improved and a difference in visibility from the display area DA may be reduced. For example, since the first transmissive portion TR1 of each of the plurality of pixels P is disposed in the display area DA, and the second transmissive portion TR2 is disposed in the non-display area NDA (or gate driver GD), transmittance of the transparent display apparatus 100 may be improved, and the difference in visibility between the display area DA and the non-display area NDA may be reduced. Therefore, a user positioned in a direction of a front side of the transparent display apparatus 100 according to one embodiment of the present disclosure may see a background or image positioned in a direction of a rear side of the transparent display apparatus 100 without a sense of difference between the display area DA and the non-display area NDA.

In addition, in the transparent display apparatus 100 according to one embodiment of the present disclosure, as the second transmissive portion TR2 is provided to have the same shape as that of the first transmissive portion TR1, the display area DA and the non-display area NDA may be formed in a similar structure to further reduce the visibility difference therebetween, whereby a user may more integrally view a background or image through the display area DA and the non-display area NDA.

The display area DA may be provided with a light emitting layer (or organic light emitting layer) to emit light, and since light is not emitted in the non-display area NDA (or the gate driver GD), the non-display area NDA may not be provided with a light emitting layer. Therefore, a difference in visibility may be generated between the display area DA and the non-display area NDA depending on the presence of the light emitting layer.

In the transparent display apparatus 100 according to one embodiment of the present disclosure, a light emitting layer or an organic light emitting layer 116 is provided on at least a portion of a non-display area NDA (or a gate driver GD), so that the difference between the display area DA and the non-display area NDA may be reduced.

In the transparent display apparatus 100 according to one embodiment of the present disclosure, when the organic light emitting layer 116 is formed using a mask having an opening of a size corresponding to the display area DA, a material constituting the organic light emitting layer 116 may be deposited by being shadowed toward an area covered by a mask, that is, the non-display area NDA (or the gate driver GD), whereby the organic light emitting layer 116 may be provided on at least a portion of the gate driver GD. Therefore, the gate driver GD may include a shadowing area SA in which the material constituting the organic light emitting layer 116 is shadowed, and a non-shadowing area NSA in which the material constituting the organic light emitting layer 116 is not shadowed.

Meanwhile, the organic light emitting layer 116 may be provided in the second transmissive portions TR2 of the shadowing area SA of the non-display area NDA, and since the organic light emitting layer 116 is formed by shadowing, its thickness may be gradually reduced toward a first direction directed from the display area DA toward an end of the first substrate 110. Therefore, a difference in visibility may occur between the second transmissive portion TR2 disposed to be close to the display area DA and the second transmissive portion TR2 disposed to be close to the end of the first substrate 110.

Therefore, in the transparent display apparatus 100 according to one embodiment of the present disclosure, organic layers PL overlapped with the plurality of second transmissive portions TR2 in the non-display area NDA may be provided at different ratios. For example, the ratio of the organic layer PL overlapped with the plurality of second transmissive portions TR2 of the shadowing area SA is gradually increased toward the first direction. In this case, the first direction may mean a direction toward the end of the first substrate 110 from the display area DA or a direction toward the non-display area NDA from the display area DA. Since the ratio of the organic layer PL provided in the non-display area NDA is different for each second transmissive portion TR2, occurrence of a difference in visibility may be reduced between the second transmissive portions TR2 disposed in the first direction directed from the display area toward the end of the substrate. In this case, the case that the ratio of the organic layer PL provided in the non-display area NDA is different for each of the second transmissive portions TR2 may mean that the ratio of the organic layer PL is different for each of the second transmissive portions TR2 in the shadowing area SA. This is because that visibility characteristics are uniform as the organic light emitting layer 116 is not provided in the non-shadowing area NSA. As shown in FIG. 2, the organic layer PL may provide a flat surface for covering the plurality of GIP lines GPL disposed in the non-display area NDA and planarizing the dummy electrode DE. The organic layer PL according to one example may be formed together with the planarization layer 113 through the same process as that of the planarization layer 113 provided in the display area DA. Therefore, the organic layer PL may be provided to be extended from the display area DA to the non-display area NDA.

Hereinafter, a subpixel SP of the transparent display apparatus 100 according to one embodiment of the present disclosure will be described with reference to FIGS. 1 and 2.

Referring to FIG. 2, the transparent display apparatus 100 according to one embodiment of the present disclosure may include a buffer layer BL disposed on the first substrate 110, preventing water from being permeated into the thin film transistor 112.

In addition, each of the subpixels SP according to one embodiment of the present disclosure may include a circuit element layer 111 provided on an upper surface of the buffer layer BL, including a gate insulating layer 111a, an interlayer insulating layer 111b, a protective layer 111c, and a thin film transistor 112, a planarization layer 113 provided on the circuit element layer 111, a first electrode 114 provided on the planarization layer 113, a bank 115, an organic light emitting layer 116, a second electrode 117, a capping layer 118, and an encapsulation layer 119. The first electrode 114, the organic light emitting layer 116, and the second electrode 117 may be included in the light emitting element.

The buffer layer BL may be formed between the first substrate 110 and the gate insulating layer 111a to protect the thin film transistor 112. The buffer layer BL may be disposed entirely on one surface (or front surface) of the first substrate 110. The buffer layer BL may serve to prevent a material contained in the first substrate 110 from being diffused into a transistor layer during a high temperature process of the manufacturing process of the thin film transistor. Optionally, the buffer layer BL may be omitted as the case may be.

The circuit element layer 111 may include a gate insulating layer 111a, an interlayer insulating layer 111b, a protective layer 111c, and a thin film transistor 112.

The thin film transistor 112 according to an example may include an active layer 112a, a gate electrode 112b, a source electrode 112c, and a drain electrode 112d.

The active layer 112a may include a channel area, a drain area and a source area, which are formed in a thin film transistor area of a circuit area of the pixel P. The drain area and the source area may be spaced apart from each other with the channel area interposed therebetween.

The active layer 112a may be formed of a semiconductor material based on any one of amorphous silicon, polycrystalline silicon, oxide and organic material.

The gate insulating layer 111a may be formed on the channel area of the active layer 112a. As an example, the gate insulating layer 111a may be formed in an island shape only on the channel area of the active layer 112a, or may be formed on an entire front surface of the first substrate 110 or the buffer layer BL, which includes the active layer 112a.

The gate electrode 112b may be formed on the gate insulating layer 111a to overlap the channel area of the active layer 112a.

The interlayer insulating layer 111b may be formed on the gate electrode 112b and the drain area and the source area of the active layer 112a. The interlayer insulating layer 111b may be formed in the circuit area and an entire light emission area, in which light is emitted to the pixel P. For example, the interlayer insulating layer 111b may be made of an inorganic material, but is not necessarily limited thereto.

The source electrode 112c may be electrically connected to the source area of the active layer 112a through a source contact hole provided in the interlayer insulating layer 111b overlapped with the source area of the active layer 112a.

The drain electrode 112d may be electrically connected to the drain area of the active layer 112a through a drain contact hole provided in the interlayer insulating layer 111b overlapped with the drain area of the active layer 112a.

The drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor may be provided in an overlap area between the gate electrode 112b and the source electrode 112c of the thin film transistor 112, which overlap each other with the interlayer insulating layer 111b interposed therebetween.

Additionally, in order to prevent a threshold voltage of the thin film transistor provided in a pixel area from being shifted by light, the display panel or the first substrate 110 may further include a light shielding layer (not shown) provided below the active layer 112a of at least one of the thin film transistor 112, the first switching thin film transistor or the second switching thin film transistor. The light shielding layer may be disposed between the first substrate 110 and the active layer 112a to shield light incident on the active layer 112a through the first substrate 110, thereby minimizing a change in the threshold voltage of the transistor due to external light.

The protective layer 111c may be provided on the first substrate 110 to cover the pixel area. The protective layer 111c covers the drain electrode 112d and the source electrode 112c of the thin film transistor 112 and the interlayer insulating layer 111b. The protective layer 111c may be entirely formed in the circuit area and the light emission area. For example, the protective layer 111c may be expressed as a passivation layer. The protective layer 111c may also be provided in the non-display area NDA as shown in FIG. 1.

The gate insulating layer 111a, the interlayer insulating layer 111b, and the protective layer 111c may be included in an inorganic layer made of an inorganic material.

The planarization layer 113 may be provided on the first substrate 110 to cover the passivation layer 111c. When the passivation layer 111c is omitted, the planarization layer 113 may be provided on the first substrate 110 to cover the circuit area. The planarization layer 113 may be formed over the circuit area and the light emission area. In addition, the planarization layer 113 may be formed on the other area except the pad area of the non-display area NDA and the entire display area DA. For example, the planarization layer 113 may include an extension portion (or enlargement) extended or enlarged from the display area DA to the other non-display area NDA except the pad area. Therefore, the planarization layer 113 may have a relatively wider size than the display area DA. Referring to FIG. 2, the planarization layer 113 may be disposed in the non-display area NDA. The planarization layer 113 disposed in the non-display area NDA may be expressed as a term of the organic layer PL. The organic layer PL disposed in the non-display area NDA may be made of the same material as that of the planarization layer 113 provided in the display area DA.

The planarization layer 113 (or the organic layer PL) according to one example may be formed to be relatively thick, thereby providing a flat surface on the display area DA and the non-display area NDA. For example, the planarization layer 113 may be made of an organic material such as photo acryl, benzocyclobutene, polyimide and fluorine resin.

The GIP portion disposed to surround the second transmissive portion TR2 may be provided in a structure similar to that of the thin film transistor 112 of the pixel P described above. Therefore, the GIP portion positioned in the gate driver GD may include an active layer, a gate electrode disposed on a gate insulating layer covering the active layer, and drain and source electrodes disposed on an interlayer insulating layer covering the gate electrode.

As shown in FIG. 2, a plurality of GIP wires GIP lines non-overlapped with the second transmissive portion TR2 may be disposed below the dummy electrode DE. Therefore, the dummy electrode DE may prevent external light from being diffused into the GIP line GPL having an uneven structure. The plurality of GIP lines GPL may be disposed between the first substrate 110 and the buffer layer BL, but are not limited thereto. The plurality of GIP lines GPL may be disposed on any one of the buffer layer BL and the plurality of inorganic layers (the gate insulating layer 111a, the interlayer insulating layer 111b and the passivation layer 111c). The passivation layer 111c may be disposed on the interlayer insulating layer 111b, and the planarization layer 113 may be disposed on the passivation layer 111c.

In the subpixel SP of FIG. 2, the first electrode 114 is connected to the drain electrode 112d of the thin film transistor 112 through a contact hole formed in the planarization layer 113 and the protective film 111c, but in the non-display area NDA of FIG. 2, the GIP line GPL is not connected to the dummy electrode provided on the organic layer PL. Likewise, a GIP circuit having a structure similar to that of thin film transistor 112 is not connected to the dummy electrode. This is because that the organic light emitting layer 116 does not emit light in the non-display area NDA.

The first electrode 114 may be formed on the planarization layer 113. The first electrode 114 is connected to the drain electrode or the source electrode of the thin film transistor 112 through a contact hole that passes through the planarization layer 113 and the protective layer 111c.

The first electrode 114 may be made of at least one of a transparent metal material, a semi-transmissive metal material, or a metal material having high reflectance.

When the transparent display apparatus 100 is provided in a top emission mode, the first electrode 114 may be formed of a metal material having high reflectance or a stacked structure of a metal material having high reflectance and a transparent metal material. For example, the first electrode 114 may be formed of a metal material having high reflectance, such as a stacked structure (Ti/Al/Ti) of aluminum and titanium, a stacked structure (ITO/Al/ITO) of aluminum and ITO, an Ag alloy, and a stacked structure (ITO/Ag alloy/ITO) of Ag alloy and ITO. The Ag alloy may be an alloy such as silver (Ag), palladium (Pd), and copper (Cu).

When the transparent display apparatus 100 is provided in a bottom emission mode, the first electrode 114 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

Meanwhile, the material constituting the first electrode 114 may include MoTi. The first electrode 114 may be a pixel electrode or an anode electrode.

The bank 115 is a non-light emission area in which light is not emitted, and may be provided to surround each of light emission areas (or light emitting portions) of the plurality of subpixels SP. That is, the bank 115 may partition (or define) the respective light emission areas (or light emitting portions).

The bank 115 may be formed on the planarization layer 113 to cover an edge of the first electrode 114, thereby partitioning (or defining) the light emission areas (or light emitting portions) of the plurality of subpixels SP.

The bank 115 may be formed to cover the edge of the first electrode 114 of each of the subpixels SP and expose a portion of each of the first electrodes 114. Therefore, a current is concentrated on an end of each of the first electrodes 114 to avoid a problem in which light emitting efficiency is degraded. An exposed portion of the first electrode 114 that is not covered by the bank 115 may be a light emission area (or light emitting portion).

The bank 115 may be formed of an organic layer such as an acrylic resin, an epoxy resin, a phenolic resin, a polyamide resin, and a polyimide resin, but is not limited thereto.

The non-display area NDA may include a dummy bank DB having a structure similar to that of a bank 115 of the display area DA. The dummy bank DB may be formed to cover an edge of each of the dummy electrodes DE and expose a portion of the dummy electrode DE. Therefore, since a pixel structure of the display area DA and a structure of the GIP portion GP of the non-display area NDA are provided to be similar to each other, the difference in visibility between the display area DA and the non-display area NDA may be reduced.

Referring back to FIG. 2, the organic light emitting layer 116 is formed on the first electrode 114 and the bank 115. When a voltage is applied to the first electrode 114 and the second electrode 117, holes and electrons move to the organic light emitting layer 116, respectively, and are combined with each other in the organic light emitting layer 116 to emit light.

The organic light emitting layer 116 may be formed of a plurality of subpixels SP and a common layer provided on the bank 115. In this case, the organic light emitting layer 116 may be provided in a tandem structure in which a plurality of light emitting layers, for example, a yellow-green light emitting layer and a blue light emitting layer are stacked, and may emit white light when an electric field is formed between the first electrode 114 and the second electrode 117.

A plurality of color filters 190 (shown in FIG. 6*a*) corresponding to colors of the corresponding subpixels SP may be formed on the second substrate 120. For example, a red color filter may be provided in a red subpixel, a green color filter may be provided in a green subpixel, and a blue color filter may be provided in a blue subpixel. Since the organic light emitting layer 116 emits white light in a white subpixel, the white subpixel may not include a color filter. A black matrix 180 may be provided between the plurality of color filters 190. The black matrix 180 may be formed at positions corresponding to the plurality of banks 115 and the plurality of dummy banks DB on the second substrate 120.

The second electrode 117 is formed on the organic light emitting layer 116. The second electrode 117 may be a common layer commonly formed in the subpixels SP. The second electrode 117 may be made of a transparent metal material, a semi-transmissive metal material or a metal material having high reflectance.

When the transparent display apparatus 100 is provided in a top emission mode, the second electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

When the transparent display apparatus 100 is provided in a bottom emission mode, the second electrode 117 may be formed of a metal material having high reflectance, such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy may be an alloy of silver (Ag), palladium (Pd), copper (Cu), etc. The second electrode 117 may be a cathode electrode.

The capping layer 118 may be formed on the second electrode 117 but may be omitted. When the capping layer 118 is formed, the capping layer 119 may be formed entirely in the display area DA. In this case, the capping layer 118 may be partially disposed in the non-display area NDA to reduce the visibility difference between the non-display area and the display area DA.

The encapsulation layer 119 is formed on the capping layer 118. The encapsulation layer 119 serves to prevent oxygen or water from being permeated into the organic light emitting layer 116 and the second electrode 117. To this end, the encapsulation layer 119 may include at least one inorganic layer.

In the transparent display apparatus 100 according to one embodiment of the present disclosure, the encapsulation layer 119 may be disposed in the non-display area NDA as well as the display area DA as shown in FIG. 2. The encapsulation layer 119 according to an example may be disposed between a transparent filling member TF and the capping layer 118 in the display area DA, and may be disposed between the capping layer 118 disposed on the buffer layer BL and a transparent connection member TD in the non-display area NDA. Therefore, the encapsulation layer 119 may overlap the first transmissive portion TR1 in the display area DA, and may overlap the second transmissive portion TR2 in the non-display area NDA.

Meanwhile, since the encapsulation layer 119 is disposed in the display area DA and extended to the non-display area NDA, the encapsulation layer 119 may be in contact with a dam (not shown) in an outer portion of the display panel. Therefore, the transparent display apparatus 100 according to one embodiment of the present disclosure may effectively prevent water permeation from the outside of the display panel toward the display area DA.

However, the encapsulation layer 119 is not limited to the above example. The encapsulation layer 119 may be extended to a portion of the non-display area NDA, and may be provided only in the display area DA without being provided in the non-display area NDA. Hereinafter, a case that the encapsulation layer 119 is disposed in the display area DA and extended to the entire non-display area NDA will be described as an example.

As shown in FIG. 2, the encapsulation layer 119 may be in contact with the transparent filling member TF in the display area DA, and may be in contact with the transparent connection member TD in the non-display area NDA. Therefore, the encapsulation layer 119 according to an example may be made of a material having a large adhesive force to at least one of the transparent filling member TF or the transparent connection member TD in order to increase the overall coupling force between the first substrate 110 and the second substrate 120.

The transparent connection member TD may be disposed between the first substrate 110 and the second substrate 120. Therefore, the first substrate 110 and the second substrate 120 may be bonded to each other by means of the transparent connection member TD. For example, the transparent connection member TD may include a thermosetting transparent adhesive or a light curable transparent adhesive. The transparent connection member TD may contain an absorbing material (not shown) for absorbing external water or moisture that is permeated into the display area DA.

The transparent connection member TD may surround the display area DA, and may be directly in contact with the encapsulation layer 119 disposed in the non-display area NDA. Also, as shown in FIG. 2, the transparent connection member TD may be disposed in the non-display area NDA to overlap the second transmissive portion TR2.

The transparent filling member TF may be disposed to be adjacent to the transparent connection member TD in the display area DA. The transparent filling member TF may be disposed to fill a gap GAP between the first substrate 110 and the second substrate 120, which are disposed in the display area DA, thereby supporting the first substrate 110 and the second substrate 120. Therefore, the transparent filling member TF may prevent the first substrate 110 and the second substrate 120, which are disposed in the display area DA, from being easily deformed by an external force. In addition, the transparent filling member TF may be provided to be disposed between the organic light emitting layer 116 formed in the first substrate 110 and the second substrate 120, thereby preventing external water or moisture permeated through the second substrate 120 from reaching the organic light emitting layer 116. That is, the transparent filling member TF may have a barrier function to block water permeation. The transparent fill member TF may further contain an absorbing material for absorbing water or moisture to enhance a moisture permeation prevention effect. For example, the absorbing material may be a getter.

Meanwhile, the transparent fill member TF may include a thermosetting transparent adhesive or a light curable transparent adhesive. In this case, the transparent filling member TF may be used to bond the first substrate 110 and the second substrate 120 to each other together with the transparent connection member TD. Therefore, a bonding force between the first substrate 110 and the second substrate 120 may be more improved.

The transparent filling member TF may be surrounded by the transparent connection member TD, and may be directly in contact with the encapsulation layer 119 disposed in the display area DA. The transparent filling member TF may be disposed in the display area DA to overlap the first transmissive portion TR1.

A difference in visibility between the non-display area NDA and the display area DA may be gradually reduced as the non-display area NDA is provided in the same structure as that of the display area DA. Therefore, in the transparent display apparatus 100 according to one embodiment of the present disclosure, the organic light emitting layer 116 provided in the display area DA may be provided in the shadowing area SA such that the difference in visibility between the display area DA and the non-display area NDA is further reduced. As described above, since the organic light emitting layer 116 provided in the shadowing area SA becomes thinner toward the first direction directed from the display area toward the end of the substrate, the difference in visibility may occur between the second transmissive portion TR2 close to the display area DA and the second transmissive portion TR2 close to the end of the first substrate 110. However, in the transparent display apparatus 100 according to one embodiment of the present disclosure, the organic layers PL overlapped with the second transmissive portions TR2 have different ratios in the shadowing area SA, whereby the difference in visibility may be reduced.

Hereinafter, the case that the organic layers PL overlapped with the second transmissive portions TR2 in the shadowing area SA of the non-display area NDA have different ratios in the transparent display apparatus 100 according to one embodiment of the present disclosure will be described in detail with reference to FIG. 2.

Referring to FIG. 2, the transparent display apparatus 100 according to one embodiment of the present disclosure may be provided such that the ratio of the organic layer PL overlapped with the second transmissive portions TR2 in the shadowing area SA is increased toward the first direction directed from the display area DA toward the end of the first substrate 110. In this case, the first direction may refer to X-axis direction. The X-axis direction may be a horizontal direction or a width direction of the first substrate 110 or a direction parallel with the gate line. As described above, since the organic light emitting layer 116 becomes thinner toward the first direction in the shadowing area SA, in the transparent display apparatus 100 of the present disclosure, the difference in visibility according to the thickness of the organic light emitting layer 116 may be compensated by the organic layer PL disposed in the shadowing area SA.

For example, as shown in FIG. 1, the transparent display apparatus 100 according to one embodiment of the present disclosure is provided such that the area (or ratio) of the organic layer PL overlapped with the second transmissive portions TR2 of the shadowing area SA is increased toward the first direction, whereby the difference in visibility from the display device DA may be reduced. The first direction may refer to a direction directed from the display area DA to the end of the first substrate 110, or a direction directed toward the non-display area NDA from the display area DA. In this case, the areas (or widths) of the second transmissive portions TR2 may be the same as each other, and the areas (or ratios) of the organic layer PL disposed in (or overlapped with) the second transmissive portions TR2 in the shadowing area SA may vary. The case that the area (or ratio) of the organic layer PL disposed in (or overlapped with) the second transmissive portions TR2 in the shadowing area SA is increased toward the first direction may mean that the area (or ratio) of the organic layer PL removed from the second transmissive portions TR2 of the shadowing area SA is reduced toward the first direction.

Referring to FIG. 2, the shadowing area SA may include a first area A1 close to a display area DA, a second area A2 adjacent to the first area A1, a third area A3 adjacent to the second area A2 and a fourth area A4 adjacent to the third area A3. The fourth area A4 may be an area adjacent to the non-shadowing area NSA. Each of the first to fourth areas A1, A2, A3 and A4 may include a GIP portion GP that includes a block portion BLK (or dummy electrode DE) and a second transmissive portion TR2.

As described above, since the second transmissive portions TR2 have the same area (or width), widths TR2 W of the second transmissive portions TR2 of the first to fourth areas A1, A2, A3 and A4 may be the same as one another. Also, in the transparent display apparatus 100 according to one embodiment of the present disclosure, the area (or ratio) of the organic layer PL that is removed from the second transmissive portion TR2 included in the first to fourth areas A1, A2, A3 and A4 may be adjusted, whereby the difference in visibility from the display area DA may be reduced. Therefore, as shown in FIG. 2, all of the second transmissive portions TR2 provided in the first to fourth areas A1, A2, A3 and A4 may include an area from the organic layer PL is removed. Therefore, the organic light emitting layer 116 disposed in the shadowing area SA may be in contact with sides of the organic layer PL disposed to be adjacent to the second transmissive portions TR2.

The passivation layer 111c may be exposed in the area from which the organic layer PL is removed, and the exposed passivation layer 111c may be in contact with the organic light emitting layer 116. In the transparent display apparatus 100 according to one embodiment of the present disclosure, since the area of the organic layer PL overlapped with the second transmissive portion TR2 in the shadowing area SA is increased toward the first direction directed from the display area toward the end of the substrate, an area (or width) W of the passivation layer 111c exposed from the second transmissive portion TR2 in the shadowing area SA may be reduced toward the first direction.

In more detail, referring to FIG. 2, since the first area A1 of the shadowing area SA is adjacent to the display area DA, a thickness ELT1 of the organic light emitting layer 116 may be the greatest relative to the second area A2 to the fourth area A4. Therefore, in the first area A1, there may be no organic layer PL overlapped with the second transmissive portion TR2. Therefore, the width TR2 W of the second transmissive portion TR2 of the first area A1 of the shadowing area SA may be the same as a width W1 of the passivation layer 111c exposed from the first area A1.

A thickness ELT2 of the organic light emitting layer 116 in the second area A2 may be thinner than that of the organic light emitting layer 116 in the first area A1. This is because the amount of the organic light emitting layer that is shadowed from the display area toward the end of the substrate is reduced. In the second area A2, the organic layer PL may overlap the second transmissive portion TR2 as much as a first overlap distance OA1. Therefore, a width W2 of the passivation layer 111c exposed from the second area A2 may be narrow as much as a width obtained by subtracting the first overlap distance OA1 at both sides of the second transmissive portion TR2 from the width TR2 W of the second transmissive portion TR2. As a result, in the second area A2, the organic layer PL overlapped with the second transmissive portion TR2 as much as the first overlap distance OA1 may compensate for a difference in visibility with respect to the thin thickness of the organic light emitting layer 116.

A thickness ELT3 of the organic light emitting layer 116 in the third area A3 may be thinner than that of the organic light emitting layer 116 in the second area A2. This is because the amount of the organic light emitting layer shadowed toward the first direction directed from the display area toward the end of the substrate in the shadowing area SA is reduced. In the third area A3, the organic layer PL may overlap the second transmissive portion TR2 as much as a second overlap distance OA2 longer than the first overlap distance OA1. Therefore, a width W3 of the passivation layer 111c exposed from the third area A3 may be narrow as much as a width obtained by subtracting the second overlap distance OA2 at both sides of the second transmissive portion TR2 from the width TR2 W of the second transmissive portion TR2. As a result, in the third area A3, the organic layer PL overlapped with the second transmissive portion TR2 as much as the second overlap distance OA2 may compensate for a difference in visibility with respect to the thin thickness of the organic light emitting layer 116.

A thickness ELT4 of the organic light emitting layer 116 in the fourth area A4 may be thinner than that of the organic light emitting layer 116 in the third area A3. This is because the amount of the organic light emitting layer shadowed toward the first direction directed from the display area toward the end of the substrate is reduced. In the fourth area A4, the organic layer PL may overlap the second transmissive portion TR2 as much as a third overlap distance OA3 longer than the second overlap distance OA2. Therefore, a width W4 of the passivation layer 111c exposed from the fourth area A4 may be narrow as much as a width obtained by subtracting the third overlap distance OA3 at both sides of the second transmissive portion TR2 from the width TR2 W of the second transmissive portion TR2. As a result, in the fourth area A4, the organic layer PL overlapped with the second transmissive portion TR2 as much as the third overlap distance OA3 may compensate for a difference in visibility with respect to the thin thickness of the organic light emitting layer 116.

In summary, since there is no organic layer PL overlapped with the second transmissive portion TR2 in the first area A1, the ratio of the organic layer PL overlapped with the second transmissive portion TR2 may be 0%. This may mean that the ratio of the organic layer PL removed from the second transmissive portion TR2 of the first area A1 is 100%. In the second area A2, since the organic layer PL overlapped with the second transmissive portion TR2 exists as much as the first overlap distance OA1, the ratio of the organic layer PL to the second transmissive portion TR2 may be 15%. This may mean that the ratio of the organic layer PL removed from the second transmissive portion TR2 of the second area A2 is 85%. Since the organic layer PL overlapped with the second transmissive portion TR2 exists in the third area A3 as much as the second overlap distance OA2, the ratio of the organic layer PL to the second transmissive portion TR2 may be 30%. This may mean that the ratio of the organic layer PL removed from the second transmissive portion TR2 of the third area A3 is 70%. Since the organic layer PL overlapped with the second transmissive portion TR2 exists in the fourth area A4 as much as the third overlap distance OA3, the ratio of the organic layer PL to the second transmissive portion TR2 may be 45%. This may mean that the ratio of the organic layer PL removed from the second transmissive portion TR2 of the fourth area A4 is 55%.

Meanwhile, since the organic light emitting layer 116 is not deposited in the non-shadowing area NSA, the organic layer PL may overlap the second transmissive area TR2 at a fourth overlap distance OA4 that is longer than the third overlap distance OA3. Therefore, a width W5 of the passivation layer 111c exposed from the non-shadowing area NSA may be further narrow as much as a width obtained by subtracting the fourth overlap distance OA4 at both sides of the second transmissive portion TR2 from the width TR2 W of the second transmissive portion TR2. As a result, since the organic light emitting layer 116 is not disposed in the non-shadowing area NSA, the difference in visibility may be compensated by only the organic layer PL overlapped with the second transmissive portion TR2 as much as the fourth overlap distance OA4. Since the organic layer PL overlapped with the second transmissive portion TR2 exists in the non-shadowing area NSA as much as the fourth overlap distance OA4, the ratio of the organic layer PL to the second transmissive portion TR2 may be 60%. This may mean that the ratio of the organic layer PL removed from the second transmissive portion TR2 of the non-shadowing area NSA is 40%. Therefore, in the transparent display apparatus 100 according to one embodiment of the present disclosure, the difference in visibility among light L1 emitted through the first transmissive portion TR1 of the display area DA, light L2 emitted through the second transmissive portion TR2 disposed in the shadowing area SA of the non-display area NDA and light L3 emitted through the second transmissive portion TR2 disposed in the non-shadowing area NSA may be reduced.

In order to increase transmittance of the first transmissive portion TR1 provided in the display area DA, the organic layer (or the planarization layer) may not be disposed in the first transmissive portion TR1 as shown in FIG. 2. Therefore, the organic layer PL overlapped with the first transmissive portion TR1 may be 0%. In the shadowing area SA, the ratio of the organic layer PL overlapped with the second transmissive portion TR2 may be less than 60%. Also, in the non-shadowing area NSA, the ratio of the organic layer PL overlapped with the second transmissive portion TR2 may be 60% or more. Since the organic light emitting layer 116 is not provided in the non-shadowing area NSA, the non-shadowing area NSA has uniform visibility, so that the ratio of the organic layer PL overlapped with the second transmissive portion TR2 may be uniformly maintained. The ratio of the organic layer PL overlapped with the first transmissive portion TR1 or the second transmissive portion TR2 may be the same as the area of the organic layer PL overlapped with the first transmissive portion TR1 or the second transmissive portion TR2.

Therefore, in the transparent display apparatus 100 according to one embodiment of the present disclosure, the area of the organic layer PL overlapped with the second transmissive portion TR2 of the shadowing area SA may be larger than the area of the organic layer PL overlapped with the first transmissive portion TR1 and smaller than the area of the organic layer PL overlapped with the second transmissive portion TR2 of the non-shadowing area NSA.

Referring back to FIG. 2, the transparent display apparatus 100 according to one embodiment of the present disclosure may be provided such that the ratio of the organic layer PL removed from the second transmissive portion TR2 provided in each of the shadowing area SA and the non-shadowing area NSA is reduced toward the first direction directed from the shadowing area SA toward the end of the substrate. That is, the ratio of the organic layer PL overlapped with the second transmissive portion TR2 may be increased toward the first direction from the shadowing area SA. Therefore, within the shadowing area SA, a width PLW of the organic layer PL disposed in the block portion BLK may be increased toward the non-shadowing area NSA from the first area A1. Therefore, a width BW of a dummy bank DB covering the edge of the dummy electrode DE disposed on the organic layer PL of the block portion BLK may be increased toward the non-shadowing area NSA from the first area A1, that is, toward the first direction.

For example, as shown in FIG. 2, a width PLW1 of the organic layer PL provided in the first area A1 may be smaller than a width PLW2 of the organic layer PL provided in the second area A2. Therefore, a width BW1 of the dummy bank DB provided on the organic layer PL of the first area A1 may be smaller than a width BW2 of the dummy bank DB provided on the organic layer PL of the second area A2.

A width PLW2 of the organic layer PL provided in the second area A2 may be smaller than a width PLW3 of the organic layer PL provided in the third area A3. Therefore, a width BW2 of the dummy bank DB provided on the organic layer PL of the second area A2 may be smaller than a width BW3 of the dummy bank DB provided on the organic layer PL of the third area A3.

A width PLW3 of the organic layer PL provided in the third area A3 may be smaller than a width PLW4 of the organic layer PL provided in the fourth area A4. Therefore, the width BW3 of the dummy bank DB provided on the organic layer PL of the third area A3 may be smaller than a width BW4 of the dummy bank DB provided on the organic layer PL of the fourth area A4. As a result, the width BW of the dummy bank DB disposed in the first area A1 to the fourth area A4 of the shadowing area SA may be expressed in the equation of BW1<BW2<BW3<BW4.

Meanwhile, in the transparent display apparatus 100 according to one embodiment of the present disclosure, the ratios of the organic layer PL to the second transmissive portions TR2 in the shadowing area SA may be different, whereby the difference in visibility from the display area DA may be reduced. This will be described with reference to FIGS. 3 and 4.

FIG. 3 is a graph illustrating color coordinates of a display area DA and a non-display area NDA. In the graph of FIG. 3, a horizontal direction may refer to X-axis of the color coordinates, and a vertical direction may refer to Y-axis of the color coordinates. Triangular shapes are the color coordinates of the display area DA, and square shapes are the color coordinates of the non-display area NDA. The color coordinates of the non-display area NDA are based on the ratio of the organic layer PL removed from the second transmissive portion TR2.

As shown in FIG. 1, since the planarization layer 113 is not disposed in the first transmissive portion TR1 of the display area DA, the color coordinates may be represented to be almost constant as shown in FIG. 3. For example, color coordinates may be formed around 0.323 of the X-axis and around 0.343 of the Y-axis. On the other hand, when the ratio of the organic layer PL removed from the second transmissive portion TR2 is gradually reduced toward the first direction directed from the display area toward the end of the substrate in the non-display area NDA in the same manner as the transparent display apparatus according to one embodiment of the present disclosure, an upward graph in which Y-axis values are increased as X-axis values are increased may be obtained.

As shown in FIG. 3, the color coordinates of the non-display area NDA may be disposed to be closest to the color coordinates of the display area DA. This means that the ratio of the organic layer PL removed from the second transmissive portion TR2 of the non-shadowing area NSA is 40%. Therefore, the transparent display apparatus 100 according to one embodiment of the present disclosure is provided such that the ratio of the organic layer PL removed from the second transmissive portion TR2 of the shadowing area SA is reduced toward the first direction from the display area toward the end of the substrate, whereby color coordinates may be formed around 0.323 of the X-axis and 0.343 of the Y-axis, which are disposed to be closest to the color coordinates of the display area DA. Therefore, the difference in visibility from the display area DA may be reduced.

Meanwhile, color coordinates, i.e., color differences, may be quantified through a three-dimensional coordinate system as shown in FIG. 4, and may be expressed in the equation of $$\Delta E^*_{ab} = \sqrt{(L^*_2 - L^*_1)^2 + (a^*_2 - a^*_1)^2 + (b^*_2 - b^*_1)^2}.$$

In this case, $\Delta E^*_{ab}$ refers to a three-dimensional coordinate system color difference, and L* of FIG. 4 refers to brightness, that is, luminance, and may be expressed in the equation of $$L^* = 116\left(\frac{Y}{Y_n}\right)^{1/3} - 16.$$

a* indicates whether a color is biased to red or green, and may be expressed in the equation of $$a^* = 500\left[\left(\frac{X}{X_n}\right)^{1/3} - \left(\frac{Y}{Y_n}\right)^{1/3}\right].$$

b* indicates whether a color is biased to yellow or blue, and may be expressed in the equation of $$b^* = 200\left[\left(\frac{Y}{Y_n}\right)^{1/3} - \left(\frac{Z}{Z_n}\right)^{1/3}\right].$$

As shown in FIG. 4, when a* is a negative number as shown in FIG. 4, a color is biased to green, and when a* is a positive number, the color is biased to red (or purple). When b* is a negative number, the color refers to blue, and when b* is a positive number, the color refers to yellow. In the above equations, X may mean a stimulus value for sensing a red color, Y may mean a stimulus value for sensing a green color, and Z may mean a stimulus value for sensing a blue color. Xn, Yn and Zn mean values for normalizing CIE XYZ for the standard white.

For example, if the Y value for the standard white is obtained, the Y value for the standard white is equal to Yn. At this time, 100 is obtained if L* is calculated, which may be a maximum value of L*. The inventor of the transparent display apparatus 100 according to one embodiment of the present disclosure tested a color deviation by using a* and b* on the assumption in that Y (brightness) is the same through correction, and devised a three-dimensional coordinate system color difference based on a removal ratio of an organic layer as follows.

| Organic layer removal ratio | 0% | 20% | 40% | 60% | 80% | 100% |
|---|---|---|---|---|---|---|
| $\Delta E^*_{ab}$ | 4.3 | 2.0 | 0.4 | 2.5 | 4.2 | 6.3 |

As shown in Table above, when the removal ratio of the organic layer PL to the second transmissive portion TR2 of the non-shadowing area NSA is 40%, the value of $\Delta E^*_{ab}$ is the lowest to 0.4. When $\Delta E^*_{ab}$ is less than 3, it means that a difference in visibility is difficult to identify, or cannot be identified, with an ordinary person's eye. Since $\Delta E^*_{ab}$ is 0.4, the difference in visibility is difficult to identify, or cannot be, identified with an expert's eye. Therefore, in the transparent display apparatus 100 according to one embodiment of the present disclosure, the removal ratio of the organic layer PL to the second transmissive portion TR2 of the shadowing area SA is reduced toward the first direction directed from the display area toward the end of the substrate, so that the value of $\Delta E^*_{ab}$ is maintained at 0.4, whereby the difference in visibility between the display area DA and the non-display area NDA may be minimized or reduced. This may mean that the transparent display apparatus 100 according to one embodiment of the present disclosure has almost the same color coordinates between the display area DA and the non-display area NDA.

Figure 5:
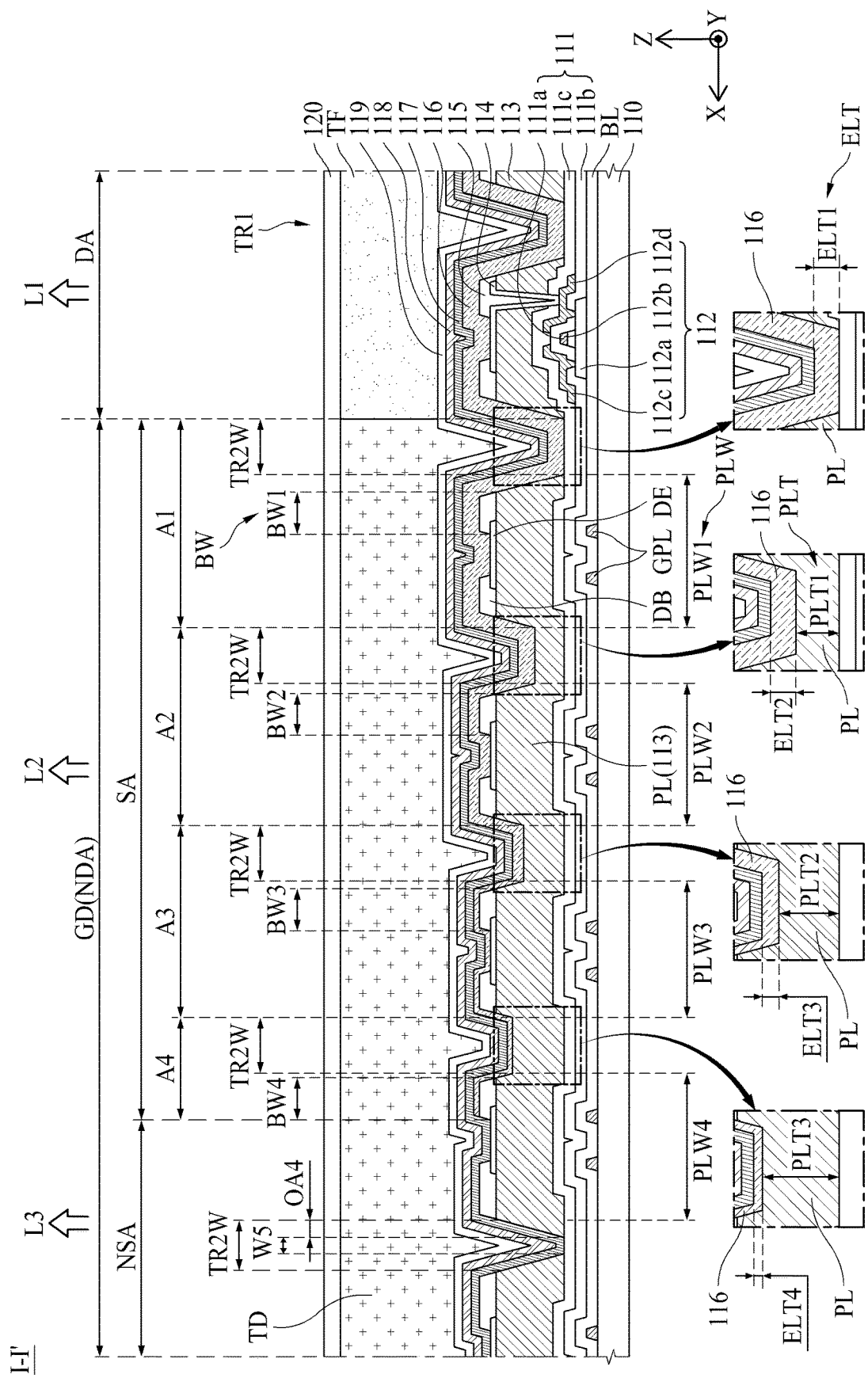
FIG. 5 is a schematic cross-sectional view illustrating a transparent display apparatus according to another embodiment of the present disclosure.

FIG. 5 is a schematic cross-sectional view illustrating a transparent display apparatus according to another embodiment of the present disclosure.

Referring to FIG. 5, the transparent display apparatus 100 according to another embodiment of the present disclosure may be provided such that the organic layer PL is fully disposed in the second transmissive portions TR2 of the shadowing area SA (or second to fourth areas A2, A3 and A4) without being removed from the second transmissive portions TR2 of the shadowing area SA, and the thickness PLT of the organic layer PL disposed in the second transmissive portions TR2 of the shadowing area SA is increased toward the first direction directed from the display area toward the end of the substrate. In the second to fourth areas A2, A3 and A4, since the second transmissive portions TR2 do not have an area from which the organic layer PL is removed, the passivation layer 111c may not be exposed. In case of the transparent display apparatus according to FIG. 5, since the difference in visibility is reduced by adjustment of the thickness PLT of the organic layer PL in the shadowing area SA, the width PLW of the organic layer PL disposed in the block portion BLK may be equally provided in the shadowing area SA. The transparent display apparatus 100 according to another embodiment of the present disclosure is the same as the display apparatus according to FIGS. 1 to 4 except the structure of the second transmissive portions TR2 disposed in the shadowing area SA and except that the width PLW of the organic layer PL is equally provided. Therefore, the same reference numerals are given to the same elements, and the following description will be based on a difference from the transparent display apparatus of FIGS. 1 to 4.

In case of the transparent display apparatus according to FIG. 1, the area (or ratio) of the organic layer PL overlapped with the second transmissive portions TR2 in the shadowing area SA of the non-display area NDA is increased toward the first direction directed from the display area toward the end of the substrate, whereby the difference in visibility between the display area DA and the non-display area NDA may be reduced by adjustment color coordinates between the display area DA and the non-display area NDA. Therefore, in case of the transparent display apparatus according to FIG. 1, the area of the organic layer PL overlapped with the second transmissive portions TR2 is increased toward the first direction directed from the first area A1 to the non-shadowing area NSA in the shadowing area SA. In addition, since the area of the organic layer PL overlapped with the second transmissive portion TR2 is increased, the width PLW of the organic layer PL is increased toward the first direction from the shadowing area SA, and the width W of the passivation layer 111c exposed from the second transmissive portions TR2 of the shadowing area SA is reduced.

In contrast, in case of the transparent display apparatus according to FIG. 5, the organic layer PL is fully disposed in the second transmissive portions TR2 of the shadowing area SA (or the second area A2 to the fourth areas A4) without being removed from the second transmissive portions TR2 of the shadowing area SA, and the thickness PLT of the organic layer PL disposed in the second transmissive portions TR2 of the shadowing area SA is increased toward the first direction directed from the display area toward the end of the substrate. In this case, since the thickness of the organic light emitting layer 116 of the second transmissive portion TR2 in the first area A1 is substantially the same as that of the first transmissive portion TR1 of the display area DA, the organic layer PL may not be provided in the second transmissive portion TR2 of the first area A1. This is because that the difference in visibility from the display area DA does not occur as the organic light emitting layer 116 is provided at a sufficient thickness in the second transmissive portion TR2 of the first area A1. Therefore, in the transparent display apparatus 100 according to another embodiment of the present disclosure, in the second transmissive portions TR2 of the shadowing area SA, an area including the organic layer PL, may refer to the second area A2 to the fourth area A4.

In the transparent display apparatus 100 according to another embodiment of the present disclosure, the second transmissive portions TR2 are disposed to overlap the organic layer PL in the second area A2 to the fourth area A4 of the shadowing area SA and the thickness PLT of the organic layer PL is thicker toward the first direction from the shadowing area SA, so that the difference in visibility from the display area DA may be reduced. In the non-shadowing area NSA, the area of the organic layer PL overlapped with the second transmissive portion TR2 may be 60% in the same manner as the transparent display apparatus of FIG. 1, so that the difference in visibility from the display area DA may be reduced. Therefore, as shown in FIG. 5, in the transparent display apparatus 100 according to another embodiment of the present disclosure, the organic layer PL may be disposed in the second transmissive portions TR2 of the shadowing area SA, and may not be partially disposed in the second transmissive portions TR2 of the non-shadowing area NSA. The thickness PLT of the organic layer PL disposed in the second transmissive portion TR2 of the shadowing area SA may mean a minimum thickness of the organic layer PL disposed in the second transmissive portion TR2 of the shadowing area SA.

In summary, since the organic light emitting layer 116 is formed to a sufficient thickness on the first transmissive portion TR1 of the display area DA, the organic layer 113 may not be disposed. Therefore, the thickness of the organic layer 113 overlapped with the first transmissive portion TR1 may be 0. Since the thickness of the organic light emitting layer 116 is reduced toward the first direction directed toward the end of the first substrate 110 in the shadowing area SA, the organic layer PL may be disposed in the second transmissive portion TR2. Therefore, the thickness of the organic layer 113 overlapped with the second transmissive portion TR2 in the shadowing area SA may be greater than 0. The organic light emitting layer 116 is not provided in the non-shadowing area NSA. However, in the non-shadowing area NSA, the area of the organic layer PL overlapped with the second transmissive portion TR2 may be 60% so that the difference in visibility from the display area DA is reduced. Therefore, the thickness of the organic layer PL overlapped with the second transmissive portion TR2 in the non-shadowing area NSA may be equal to or almost similar to the thickness of the organic layer PL that is not overlapped with the second transmissive portion TR2.

As a result, in the transparent display apparatus 100 according to another embodiment of the present disclosure, the thickness of the organic layer PL overlapped with the second transmissive portion TR2 of the shadowing area SA may be thicker than the thickness of the organic layer PL overlapped with the first transmissive portion TR1, and may be thinner than the thickness of the organic layer PL overlapped with the second transmissive portion TR2 of the non-shadowing area NSA.

Referring back to FIG. 5, in the transparent display apparatus 100 according to another embodiment of the present disclosure, since the thickness of the organic light emitting layer 116 is reduced toward the first direction directed from the display area toward the end of the substrate in the shadowing area SA, the thickness of the organic layer PL disposed on the second transmissive portions TR2 in the shadowing area SA may be increased toward the first direction. That is, the difference in visibility based on decrease in the thickness of the organic light emitting layer 116 in the shadowing area SA may be compensated by increasing the thickness PLT of the organic layer PL disposed in the second transmissive portions TR2 of the shadowing area SA. Therefore, in the transparent display apparatus 100 according to another embodiment of the present disclosure, the thickness PLT of the organic layer PL disposed in the second transmissive portions TR2 of the shadowing area SA (the second to fourth areas A2, A3 and A4) may be inversely proportional to the thickness ELT of the organic light emitting layer 116 disposed on the organic layer PL of the second transmissive portions TR2 of the shadowing area SA.

For example, the organic layer PL is provided to be thin at a place where the organic light emitting layer 116 is thick, and the organic layer PL may be provided to be thick at a place where the organic light emitting layer 116 is thin. Therefore, as shown in FIG. 5, the thickness ELT of the organic light emitting layer 116 disposed in the shadowing area SA may be reduced toward the first direction directed from the display area toward the end of the substrate, and the thickness PLT of the organic layer PL disposed in the second transmissive portions TR2 of the shadowing area SA may be increased toward the first direction.

For example, since the organic light emitting layer 116 is provided to be sufficiently thick in the first area A1, the difference in visibility from the display area DA may not be generated. Therefore, in the first area A1, the organic layer PL may not be disposed in the second transmissive portion TR2.

In the second area A2, since the thickness ELT2 of the organic light emitting layer 116 is thinner than the organic light emitting layer 116 of the first area A1, the organic layer PL may be provided to overlap the second transmissive portion TR2 at a first thickness PLT1.

In the third area A3, since the thickness ELT3 of the organic light emitting layer 116 is thinner than the organic light emitting layer 116 of the second area A2, the organic layer PL may be provided to overlap the second transmissive portion TR2 at a second thickness PLT2 thicker than the first thickness PLT1.

In the fourth area A4, since the thickness ELT4 of the organic light emitting layer 116 is thinner than the organic light emitting layer 116 of the third area A3, the organic layer PL may be provided to overlap the second transmissive portion TR2 at a third thickness PLT3 thicker than the second thickness PLT2. Therefore, the thickness PLT of the organic layer PL overlapped with the second transmissive portion TR2 in the second to fourth areas A2, A3 and A4 of the shadowing area SA may be expressed in the equation of PLT1<PLT2<PLT3.

Meanwhile, since the organic layer PL is disposed to overlap the second transmissive portion TR2 in the other shadowing area SA except the first area A1, the passivation layer 111c may not be exposed. In addition, since the second to fourth areas A2, A3 and A4 reduce the difference in visibility due to the thickness PLT of the organic layer PL, the width PLW of the organic layer PL disposed in the block portion BLK may be provided equally in the second to fourth areas A2, A3 and A4. Therefore, the width BW of the dummy bank DB disposed on the organic layer PL of the second to fourth areas A2, A3 and A4 may be provided equally.

As a result, in the transparent display apparatus 100 according to another embodiment of the present disclosure, since the thickness of the organic light emitting layer 116 is reduced toward the first direction directed from the display area toward the end of the substrate in the shadowing area SA, the thickness of the organic layer PL disposed in the second transmissive portions TR2 of the second to fourth areas A2, A3 and A4 in which the thickness of the organic light emitting layer is reduced may be increased toward the first direction from the shadowing area SA. Therefore, in the transparent display apparatus 100 according to another embodiment of the present disclosure, the thickness of the organic layer PL disposed in the second transmissive portions TR2 of the second to fourth areas A2, A3 and A4 is gradually increased, whereby the difference in visibility between the display area DA and the non-display area NDA may be reduced. Also, in the transparent display apparatus 100 according to another embodiment of the present disclosure, since the organic layer PL is disposed in the second transmissive portion TR2 of the second to fourth areas A2, A3 and A4, the passivation layer 111c may not be exposed, and the width PLW of the organic layer PL disposed in the block portion BLK and the width BW of the dummy bank DB may be equally provided in the second to fourth areas A2, A3 and A4.

Figure 6A:
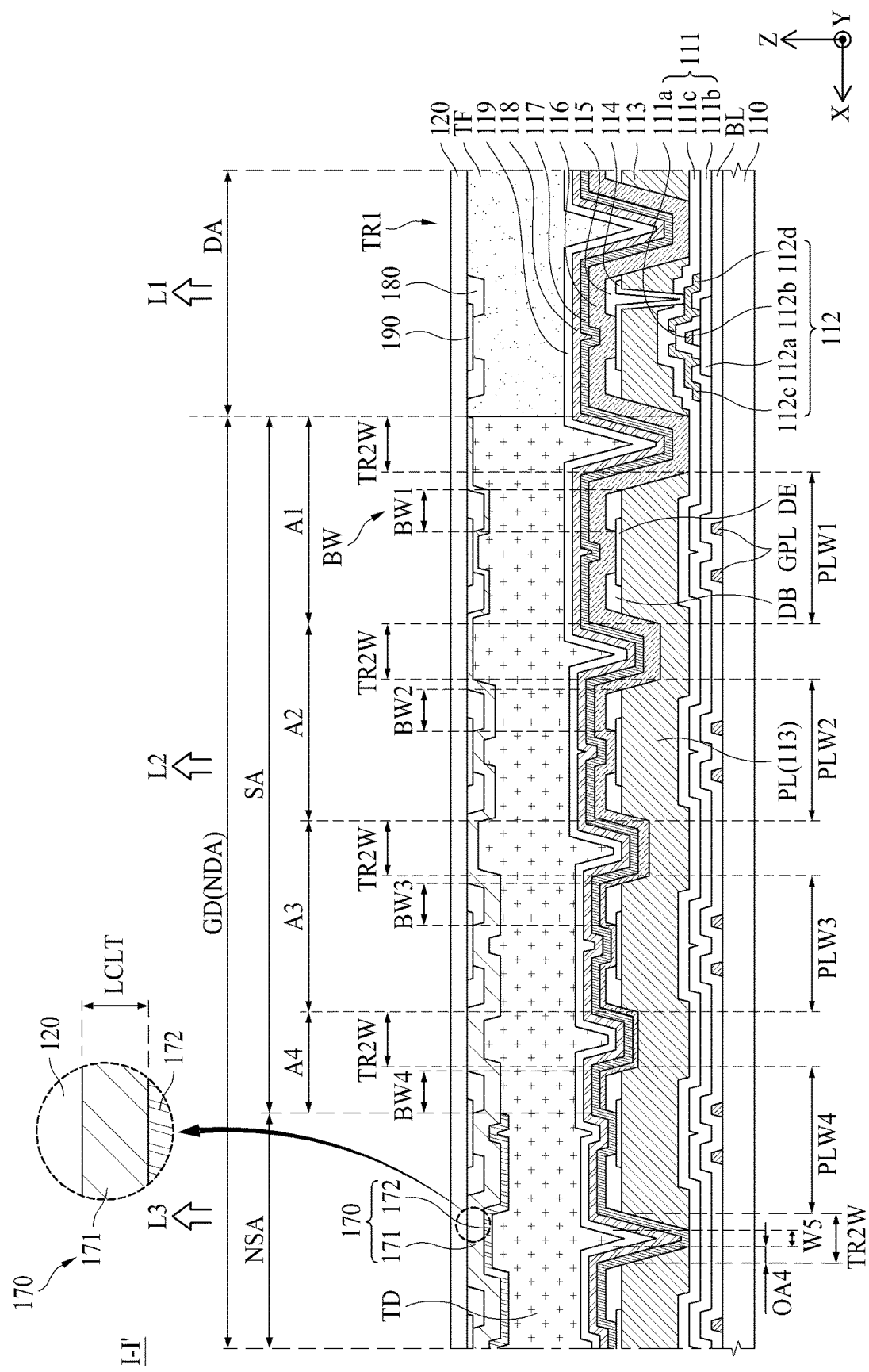
FIG. 6a is a schematic cross-sectional view illustrating a transparent display apparatus according to still another embodiment of the present disclosure.

FIG. 6a is a schematic cross-sectional view illustrating a transparent display apparatus according to still another embodiment of the present disclosure.

Referring to FIG. 6a, the transparent display apparatus 100 according to another embodiment of the present disclosure is the same as the display apparatus of FIG. 5 except that the opposite substrate or the second substrate 120 further includes a black matrix 180 and a color filter 190 and the non-display area NDA further includes a light compensation layer 170. Therefore, the same reference numerals are given to the same elements, and the following description will be based on a difference from the transparent display apparatus of FIG. 5.

In case of the transparent display apparatus according to FIG. 5, the thickness PLT of the organic layer PL disposed in the second transmissive portions TR2 in the shadowing area SA of the non-display area NDA is increased toward the first direction directed from the display area toward the end of the substrate, whereby the difference in visibility between the display area DA and the non-display area NDA may be reduced by adjustment of color coordinates between the display area DA and the non-display area NDA. That is, the transparent display apparatus according to FIG. 5 has a structure in which the color coordinates between the display area DA and the non-display area NDA are adjusted.

In contrast, in case of the transparent display apparatus according to FIG. 6a, the light compensation layer 170 is additionally provided on the second substrate 120, whereby a brightness difference, that is, a luminance difference between the display area DA and the non-display area NDA may be reduced. The light compensation layer 170 may be provided in the non-display area NDA, for example, the gate driver GD. The light compensation layer 170 may include at least one of a first layer 171 absorbing light and a second layer 172 reflecting light, but is not limited thereto. The first layer 171 may be provided to reflect light, and the second layer 172 may be provided to absorb light. The light compensation layer 170 may partially absorb or partially reflect light emitted through the second transmissive portion TR2, thereby reducing luminance of the light emitted through the second substrate 120. Therefore, in the transparent display apparatus 100 according to FIG. 6a, the luminance difference between the display area DA and the non-display area NDA may be reduced through the light compensation layer 170. Hereinafter, the transparent display apparatus 100 according to still another embodiment of the present disclosure will be described in detail with reference to FIG. 6a.

As shown in FIG. 6a, a plurality of black matrixes 180 may be provided on the second substrate 120 to correspond to the plurality of banks 115 and the plurality of dummy banks DB, respectively. The color filter 190 having a color corresponding to the color of the corresponding subpixel SP may be provided between the plurality of black matrixes 180. For example, a red color filter may be disposed in the red subpixel, a red color filter may be disposed in the green subpixel, and a blue color filter may be disposed in the blue subpixel. The white subpixel may not include a color filter, but is not limited thereto. The color filter 190 may be also provided in the non-display area NDA to reduce the difference in visibility from the display area DA. The color filter 190 provided in the non-display area NDA may be provided on the second substrate 120 to correspond to the dummy electrode DE.

FIG. 6a illustrates that the light compensation layer 170 includes a first layer 171 and a second layer 172. As shown in FIG. 6a, since the thickness of the organic light emitting layer 116 overlapped with the second transmissive portions TR2 provided in the shadowing area SA of the non-display area NDA is reduced toward the first direction directed from the display area toward the end of the substrate, luminance emitted from the second transmissive portions TR2 may be increased toward the first direction. Therefore, the transparent display apparatus 100 according to another embodiment of the present disclosure is provided such that a thickness LCLT of the light compensation layer 170 is increased toward the first direction from the shadowing area SA, the luminance difference between the first area A1 to the fourth area A4 of the shadowing area SA may be reduced. Meanwhile, since there is no organic light emitting layer 116 in the non-shadowing area NSA, luminance of the light emitted through the second transmissive portion TR2 may be the highest. Therefore, as shown in FIG. 6a, a second layer 172 covering the first layer 171 may be additionally provided in the non-shadowing area NSA. Since the first layer 171 and the second layer 172 are disposed to overlap each other in the non-shadowing area NSA, luminance of the light emitted through the second substrate 120 may be reduced. As a result, the light compensation layer 170 may be formed as a single layer in the shadowing area SA, and may be provided as a plurality of layers in the non-shadowing area NSA. For example, only the first layer 171 may be provided in the shadowing area SA, and the first layer 171 and the second layer 172 may be stacked in the non-shadowing area NSA.

Meanwhile, since there is no organic light emitting layer 116 in the non-shadowing area NSA, both the thickness LCLT of the first layer 171 and the thickness of the second layer 172 may be uniformly provided. As a result, in the transparent display apparatus 100 according to still another embodiment of the present disclosure, the light compensation layer 170 is provided in the non-display area NDA so that its thickness is increased toward the first direction directed from the display area toward the end of the substrate in the shadowing area SA, whereby the luminance difference between the display area DA and the non-display area NDA may be reduced. Therefore, in the transparent display apparatus 100 according to still another embodiment of the present disclosure, the luminance difference as well as the difference in visibility among the light L1 emitted through the first transmissive portion TR1 of the display area DA, the light L2 emitted through the second transmissive portion TR2 disposed in the shadowing area SA of the non-display area NDA and the light L3 emitted through the second transmissive portion TR2 disposed in the non-shadowing area NSA may be reduced, so that the overall integrity of the transparent display apparatus may be improved.

Figure 6B:
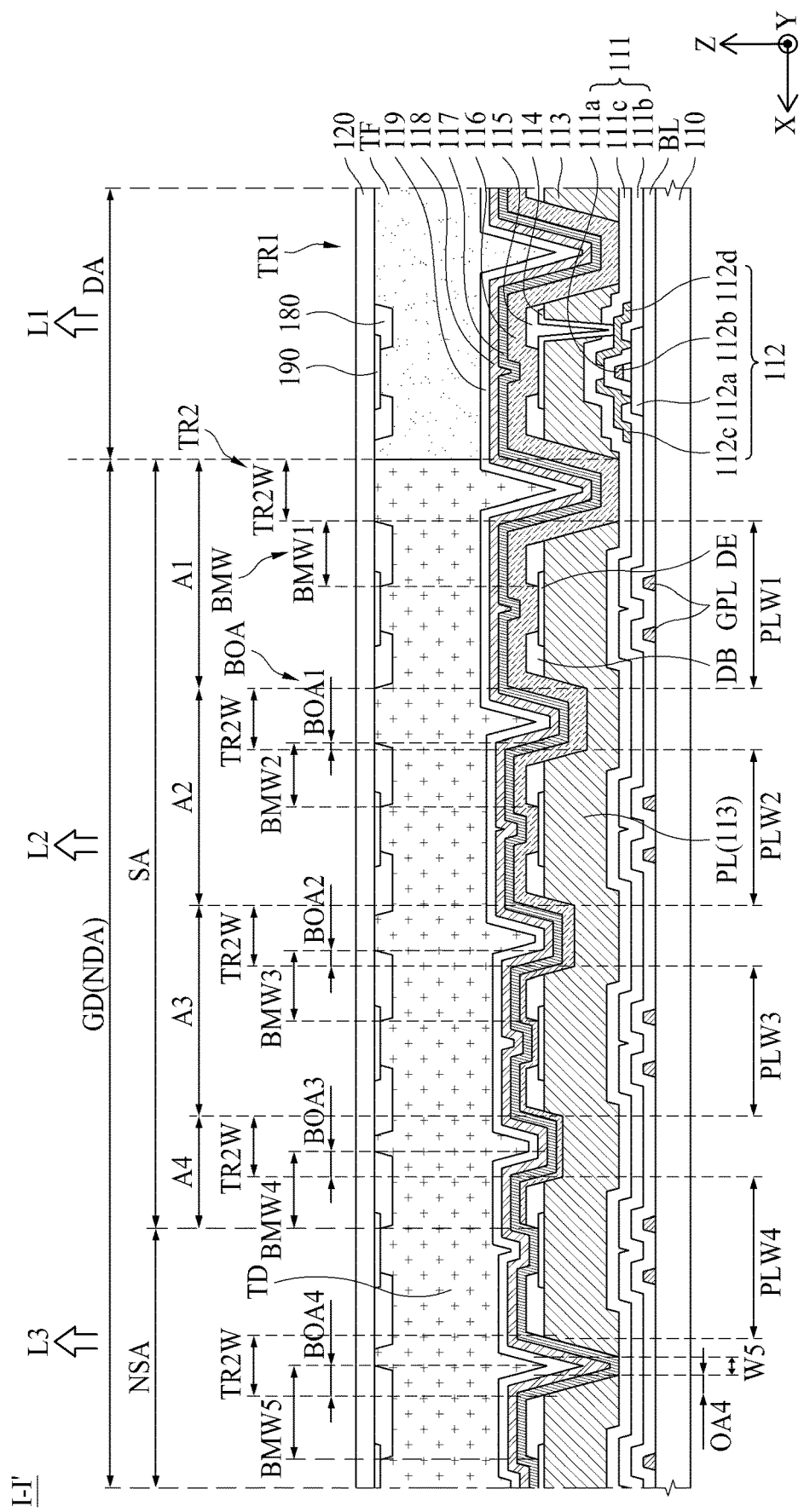
FIG. 6b is a schematic cross-sectional view illustrating a transparent display apparatus according to further still another embodiment of the present disclosure.

FIG. 6b is a schematic cross-sectional view illustrating a transparent display apparatus according to further still another embodiment of the present disclosure.

Referring to FIG. 6b, the transparent display apparatus 100 according to another alternative embodiment of the present disclosure is the same as the display apparatus of FIG. 5 except that the opposite substrate or the second substrate 120 further includes a black matrix 180 and a color filter 190 and the width of the black matrix 180 is increased toward the first direction directed from the display area toward the end of the substrate without the light compensation layer 170 in the non-display area NDA. Therefore, the same reference numerals are given to the same elements, and the following description will be based on a difference from the transparent display apparatus of FIG. 5.

In case of the transparent display apparatus according to FIG. 6a, the light compensation layer 170 is additionally provided in the non-display area NDA, and the thickness of the light compensation layer 170 is reduced toward the first direction directed from the display area to the end of the substrate in the shadowing area SA, whereby the luminance difference between the display area DA and the non-display area NDA may be reduced.

In contrast, in case of the transparent display apparatus according to FIG. 6b, the light compensation layer 170 is not provided in the non-display area NDA and the width of the black matrix 180 in the shadowing area SA is adjusted, whereby the luminance difference between the display area DA and the non-display area NDA may be reduced. For example, in case of the transparent display apparatus according to FIG. 6b, a width BMW of the plurality of black matrixes 180 provided in the shadowing area SA of the non-display area NDA may be increased toward the first direction from the display area toward the end of the substrate. Therefore, an overlap interval BOA in which the black matrix 180 and the second transmissive portion TR2 overlap each other in the non-display area NDA may be increased toward the first direction.

For example, as shown in FIG. 6b, the black matrix 180 disposed in the first area A1 may be provided so as not to overlap the second transmissive portion TR2. This is because that the organic light emitting layer 116 is provided at a sufficient thickness in the second transmissive portion TR2 disposed in the first area A1. Therefore, a width BMW1 of the black matrix 180 disposed in the first area A1 may be provided so as not to overlap the second transmissive portion TR2.

A width BMW2 of the black matrix disposed in the second area A2 may be wider than the width BMW1 of the black matrix disposed in the first area A1. Therefore, the black matrix 180 disposed in the second area A2 may overlap the second transmissive portion TR2 at a first overlap interval BOA1.

A width BMW3 of the black matrix disposed in the third area A3 may be wider than the width BMW2 of the black matrix disposed in the second area A2. Therefore, the black matrix 180 disposed in the third area A3 may overlap the second transmissive portion TR2 at a second overlap interval BOA2 wider than the first overlap interval BOA1.

A width BMW4 of the black matrix disposed in the fourth area A4 may be wider than the width BMW3 of the black matrix disposed in the third area A3. Therefore, the black matrix 180 disposed in the fourth area A4 may overlap the second transmissive portion TR2 at a third overlap interval BOA3 wider than the second overlap interval BOA2.

A width BMW5 of the black matrix disposed in the non-shadowing area NSA may be wider than the width BMW4 of the black matrix disposed in the fourth area A4. Therefore, the black matrix 180 disposed in the non-shadowing area NSA may overlap the second transmissive portion TR2 at a fourth overlap interval BOA4 wider than the third overlap interval BOA3. Therefore, as shown in FIG. 6b, the plurality of black matrixes 180 may be provided in the shadowing area SA of the non-display area NDA so that their width BOA overlapped with the second transmissive portions TR2 may be increased toward the first direction directed from the display area toward the end of the substrate.

As a result, in the transparent display apparatus 100 according to another modified embodiment of the present disclosure, the width of the black matrix 180 overlapped with the second transmissive portion TR2 in the non-display area NDA without the light compensation layer 170 is increased toward the first direction from the shadowing area SA, whereby the luminance difference between the display area DA and the non-display area NDA may be reduced. Therefore, in the transparent display apparatus 100 according to another modified embodiment of the present disclosure, the luminance difference as well as the difference in visibility between the display area DA and the non-display area NDA may be reduced, whereby the overall integrity of the transparent display apparatus may be improved.

According to the present disclosure, the following advantageous effects may be obtained.

In the present disclosure, the ratios (or areas) of the organic layer overlapped with the transmissive portions of the non-display area are different from each other, so that the difference in visibility between the non-display area and the display area may be reduced.

Also, the thicknesses of the organic layers provided in the transmissive portions of the non-display area are different from each other, so that the difference in visibility between the non-display area and the display area may be reduced.

In addition, the light compensation layer is provided to correspond to the transmissive portions of the non-display area, so that the luminance difference between the non-display area and the display area may be reduced.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus, comprising:
   a display area disposed on a substrate, the display area including a plurality of pixels, each of the plurality of pixels having a first transmissive portion;
   a non-display area disposed near the display area on the substrate, the non-display area having a plurality of second transmissive portions, wherein the non-display area further includes an organic layer provided to be extended from the display area; and
   wherein ratios of overlap between the organic layer and each of the plurality of second transmissive portions in the non-display area are different from each other.

2. The transparent display apparatus of claim 1, wherein the organic layer covers a plurality of gate driver in panel (GIP) lines disposed in the non-display area and provides a flat surface.

3. The transparent display apparatus of claim 1, wherein the non-display area includes a shadowing area adjacent to the display area and a non-shadowing area adjacent to the shadowing area; and
   the ratios of overlap between the organic layer and each of the plurality of second transmissive portions disposed in the shadowing area are increased toward a first direction directed from the display area toward an end of the substrate.

4. The transparent display apparatus of claim 3, wherein an organic light emitting layer of the display area is disposed to be extended in the shadowing area; and
   the organic light emitting layer disposed in the shadowing area is in contact with the organic layer disposed to be adjacent to the second transmissive portions.

5. The transparent display apparatus of claim 3, wherein an area of the organic layer overlapped with each of the plurality of second transmissive portions is increased toward the first direction from the shadowing area.

6. The transparent display apparatus of claim 5, further comprising:
   a passivation layer provided in the entire non-display area between the substrate and the organic layer, wherein the passivation layer disposed in the non-display area is partially exposed from the plurality of second transmissive portions,
wherein an area of the passivation layer exposed from the plurality of second transmissive portions is reduced toward the first direction from the shadowing area.

7. The transparent display apparatus of claim 3, wherein the non-display area includes a plurality of dummy electrodes disposed on the organic layer and a plurality of dummy banks covering an edge of each of the plurality of dummy electrodes; and
a width of the plurality of dummy banks is increased toward the first direction from the shadowing area.

8. The transparent display apparatus of claim 3, wherein the non-display area includes a shadowing area adjacent to the display area and a non-shadowing area adjacent to the shadowing area, and
a thickness of the organic layer disposed in the plurality of second transmissive portions of the shadowing area is increased toward the first direction from the shadowing area.

9. The transparent display apparatus of claim 3, further comprising:
an opposite substrate disposed to face the substrate,
wherein the opposite substrate includes a light compensation layer disposed to correspond to the non-display area.

10. The transparent display apparatus of claim 9, wherein a thickness of the light compensation layer is increased toward the first direction from the shadowing area.

11. The transparent display apparatus of claim 9, wherein the light compensation layer includes at least one of a first layer absorbing light or a second layer reflecting light.

12. The transparent display apparatus of claim 9, wherein the light compensation layer is provided as a single layer in the shadowing area, and is provided as a plurality of layers in the non-shadowing area.

13. The transparent display apparatus of claim 3, further comprising:
an opposite substrate disposed to face the substrate, the opposite substrate having a plurality of black matrixes;
wherein the non-display area includes a plurality of dummy electrodes disposed on the organic layer and a plurality of dummy banks covering an edge of each of the plurality of dummy electrodes;
wherein the plurality of black matrixes are disposed to correspond to the plurality of dummy banks; and
wherein a width of the plurality of black matrixes is increased toward the first direction from the shadowing area.

14. The transparent display apparatus of claim 13, wherein a width of the plurality of black matrixes overlapped with the plurality of second transmissive portions is increased toward the first direction from the shadowing area.

15. The transparent display apparatus of claim 3, wherein an area of the organic layer overlapped with second transmissive portions of the plurality of second transmissive portions of the shadowing area is larger than that of the organic layer overlapped with the first transmissive portion, and is smaller than that of the organic layer overlapped with the second transmissive portion of the non-shadowing area.

16. The transparent display apparatus of claim 3, wherein a thickness of the organic layer overlapped with second transmissive portions of the plurality of second transmissive portions of the shadowing area is thicker than that of the organic layer overlapped with the first transmissive portion, and is thinner than that of the organic layer overlapped with second transmissive portions of the plurality of second transmissive portions of the non-shadowing area.

17. The transparent display apparatus of claim 1, wherein the non-display area includes a shadowing area adjacent to the display area and a non-shadowing area adjacent to the shadowing area, and
the organic layer is partially disposed in the plurality of second transmissive portions of the shadowing area and is not partially disposed in the plurality of second transmissive portions of the non-shadowing area.

18. The transparent display apparatus of claim 1, wherein the non-display area includes a shadowing area adjacent to the display area and a non-shadowing area adjacent to the shadowing area,
an organic light emitting layer of the display area is disposed to be extended in the shadowing area; and
a thickness of the organic layer disposed in the plurality of second transmissive portions of the shadowing area is inversely proportional to that of the organic light emitting layer disposed on the organic layer of the plurality of second transmissive portions.

19. A transparent display apparatus, comprising:
a display area disposed on a substrate, the display area including a plurality of pixels, each of the plurality of pixels having a first transmissive portion; and
a non-display area disposed near the display area on the substrate, the non-display area having a shadowing area in which an organic light emitting layer of the display area is disposed to be extended and a plurality of second transmissive portions, wherein the non-display area further includes an organic layer provided to be extended from the display area;
wherein ratios of overlap between the organic layer and each of the plurality of second transmissive portions are increased toward a first direction directed from the display area toward an end of the substrate in the shadowing area.

20. The transparent display apparatus of claim 19, wherein
the non-display area further includes a non-shadowing area adjacent to the shadowing area; and
a thickness of the organic light emitting layer disposed in the shadowing area is reduced toward the first direction.

21. The transparent display apparatus of claim 19, wherein the organic light emitting layer disposed in the shadowing area is in contact with a side of the organic layer disposed to be adjacent to the plurality of second transmissive portions.

22. The transparent display apparatus of claim 19, wherein
second transmissive portions of the plurality of second transmissive portions that are disposed in the shadowing area are disposed to partially overlap the organic layer; and
a thickness of the organic layer overlapped with the second transmissive portions in the shadowing area is increased toward the first direction.

23. The transparent display apparatus of claim 19, wherein a thickness of the organic layer disposed in second transmissive portions of the plurality of second transmissive portions of the shadowing area and a thickness of the organic light emitting layer are inversely proportional to each other.

24. The transparent display apparatus of claim 19, further comprising:
- an opposite substrate disposed to face the substrate, wherein the opposite substrate includes a light compensation layer disposed to correspond to the non-display area; and
- a thickness of the light compensation layer is increased toward the first direction from the shadowing area.

* * * * *